(12) United States Patent
Buller et al.

(10) Patent No.: US 7,963,813 B2
(45) Date of Patent: Jun. 21, 2011

(54) APPARATUS AND METHODS FOR CONNECTING MULTIPLE PHOTOVOLTAIC MODULES

(75) Inventors: Benyamin Buller, Fremont, CA (US); Tim Leong, Fremont, CA (US)

(73) Assignee: Solyndra, Inc., Fremont, CA (US)

( * ) Notice: Subject to any disclaimer, the term of this patent is extended or adjusted under 35 U.S.C. 154(b) by 0 days.

(21) Appl. No.: 11/982,612

(22) Filed: Nov. 2, 2007

(65) Prior Publication Data

US 2008/0113567 A1     May 15, 2008

Related U.S. Application Data

(60) Provisional application No. 60/859,213, filed on Nov. 15, 2006, provisional application No. 60/859,212, filed on Nov. 15, 2006, provisional application No. 60/859,188, filed on Nov. 15, 2006, provisional application No. 60/859,033, filed on Nov. 15, 2006, provisional application No. 60/859,215, filed on Nov. 15, 2006, provisional application No. 60/861,162, filed on Nov. 27, 2006, provisional application No. 60/901,517, filed on Feb. 14, 2007.

(51) Int. Cl.
    *H01R 9/24*     (2006.01)

(52) U.S. Cl. ........................................................ 439/884

(58) Field of Classification Search .................. 439/660, 439/884, 358, 567, 544; 136/246, 244, 251
See application file for complete search history.

(56) References Cited

U.S. PATENT DOCUMENTS

| | | | | |
|---|---|---|---|---|
| 4,043,315 | A | | 8/1977 | Cooper |
| 5,590,495 | A | * | 1/1997 | Bressler et al. ............. 52/173.3 |
| 5,603,627 | A | * | 2/1997 | Evanisko .................... 439/235 |
| 6,150,602 | A | | 11/2000 | Campbell |
| 6,201,180 | B1 | * | 3/2001 | Meyer et al. ................. 136/244 |
| 6,235,984 | B1 | | 5/2001 | Wambach et al. |
| 6,465,724 | B1 | * | 10/2002 | Garvison et al. ............. 136/244 |
| 7,121,884 | B2 | * | 10/2006 | Osada ......................... 439/582 |
| 2005/0217664 | A1 | * | 10/2005 | Patterson .................... 126/634 |
| 2006/0118163 | A1 | | 6/2006 | Plaisted et al. |
| 2006/0243318 | A1 | | 11/2006 | Feldmeier et al. |
| 2006/0288852 | A1 | * | 12/2006 | Zinell et al. ....................... 89/6 |
| 2007/0102038 | A1 | * | 5/2007 | Kirschning .................. 136/251 |

FOREIGN PATENT DOCUMENTS

| | | | |
|---|---|---|---|
| JP | 09135039 | * | 5/1997 |
| JP | 2000-294821 | * | 10/2000 |
| JP | 2007-250857 | * | 9/2007 |

* cited by examiner

*Primary Examiner* — Alexander Gilman
(74) *Attorney, Agent, or Firm* — E. Randall Smith; Jones & Smith, LLP

(57) ABSTRACT

In some embodiments, an apparatus for electrically connecting a plurality of photovoltaic modules in a solar panel includes a first electrically conductive line engageable with and capable of electrically connecting a plurality of first output contacts of the photovoltaic modules along a common axis.

19 Claims, 4 Drawing Sheets

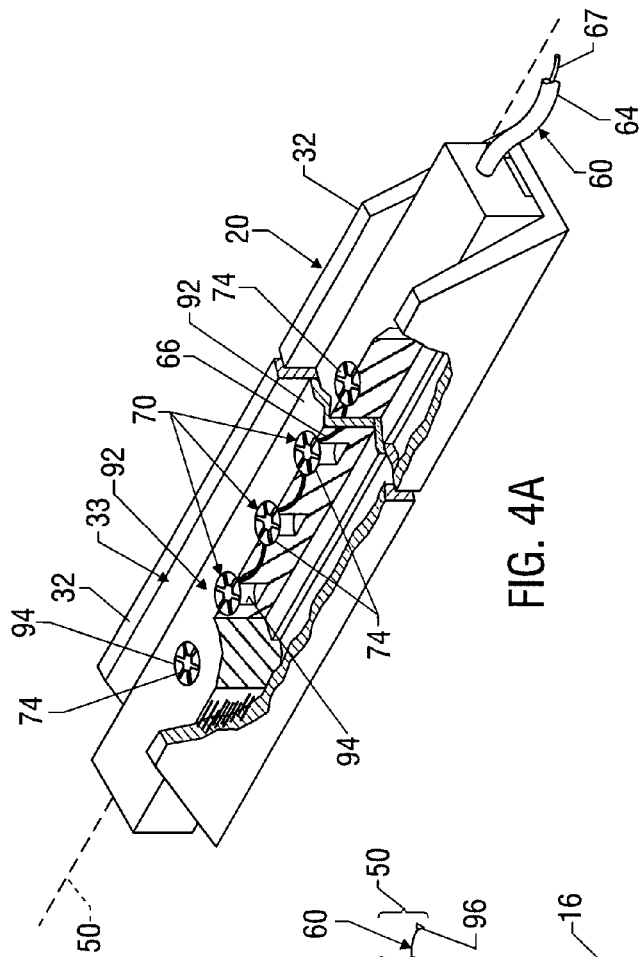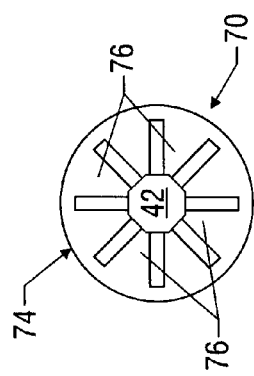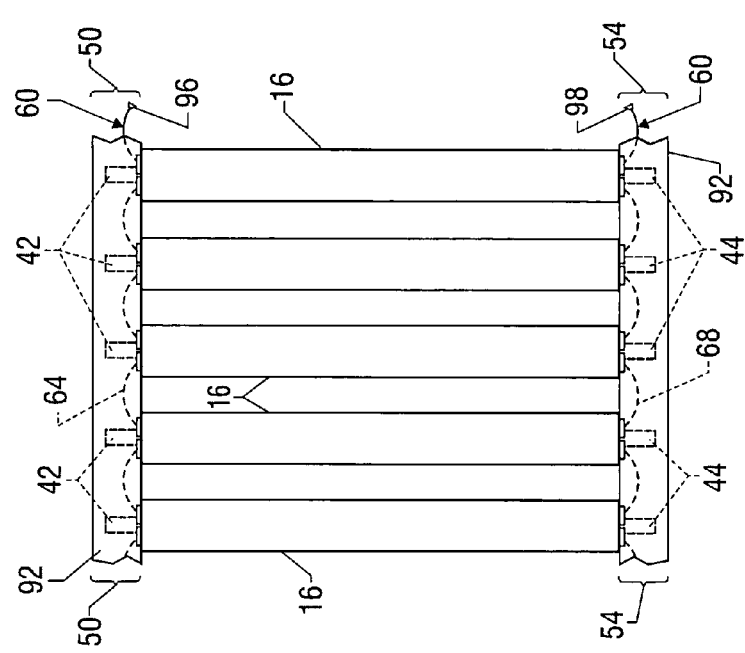
FIG. 4A
FIG. 4B
FIG. 3

APPARATUS AND METHODS FOR CONNECTING MULTIPLE PHOTOVOLTAIC MODULES

This application claims priority to U.S. provisional application Ser. Nos. 60/859,213, 60/859,212, 60/859,188, 60/859,033, 60/859,215, 60/861,162, 60/901,517, and incorporates the preceding applications by reference herein in their entireties.

BACKGROUND

This disclosure relates to photovoltaic energy absorption/collection technology. In some embodiments, this disclosure relates to apparatus and methods for electrically connecting two or more photovoltaic modules in a solar panel.

Various known photovoltaic energy absorption/collection devices, such as solar panels, include an array of essentially flat photovoltaic modules arranged side-by-side and placed in a box-like housing. Typically, the modules are coated with a clear, thermoset elastomer and the housing is sealed with a clear faceplate. The modules are thus typically rendered immobile within a "sandwich" of materials in large flat panels.

The photovoltaic modules are often electrically connected together by a series connection that weaves amongst the modules lying in the housing. In some instances, such arrangement may have disadvantages. For example, every turn and span of the connection configuration could be subject to breakage or separation. For another example, due to the sandwich-like configuration, when a module or connection fails, it is difficult or impossible to replace the module or repair the connection buried in the panel.

It should be understood, however, that the above-described examples, features and/or disadvantages are provided for illustrative purposes only and are not intended to limit the scope or subject matter of this patent, any other patent claiming priority hereto or any claim thereof. Thus, none of the appended claims, or claims of any related patent application or patent, should be limited by the above discussion or construed to address, include or exclude the above-cited examples, features and/or disadvantages, except and only to the extent as may be expressly stated in a particular claim. Further, the above exemplary disadvantages should be evaluated on a case-by-case basis to determine if they may exist.

BRIEF SUMMARY

In some embodiments, the present disclosure involves an apparatus for electrically connecting a plurality of photovoltaic modules located within a solar panel. Each photovoltaic module includes a first output contact that extends at least partially on a first common axis. A first electrically conductive line is engageable with and capable of electrically connecting the first output contacts of the photovoltaic modules along the first common axis.

Various embodiments of the present disclosure involve an apparatus for electrically connecting a plurality of photovoltaic modules disposed within a solar panel. The solar panel includes a frame having first and second opposing side rails and first and second opposing end rails. A first electrically conductive line extends at least partially through, and electrically connects together the plurality of photovoltaic modules within, at least one among the first and second opposing side rails and the first and second opposing end rails of the frame.

There are embodiments of the present disclosure that involve an apparatus capable of electrically connecting a plurality of elongated photovoltaic modules disposed in generally spaced parallel relationship with one another within a solar energy absorption device. Each of the elongated photovoltaic modules includes an anode output contact that extends at least partially on a first common axis and a cathode output contact that extends at least partially on a second common axis. A first electrically conductive line is engageable with and capable of electrically connecting together the cathode output contacts along the first common axis. A second electrically conductive line is engageable with and capable of electrically connecting together the anode output contacts along the second common axis.

Accordingly, the present disclosure includes features and advantages which are believed to enable it to advance solar energy absorption or collection technology. Characteristics and advantages of the present disclosure described above and additional features and benefits will be readily apparent to those skilled in the art upon consideration of the following detailed description and referring to the accompanying drawings.

BRIEF DESCRIPTION OF THE DRAWINGS

The following figures are part of the present specification, included to demonstrate certain aspects of embodiments of the present disclosure and referenced in the detailed description herein.

FIG. 3 is a partial top view of multiple example photovoltaic modules being electrically connected by first and second electrically conductive lines in accordance with an embodiment of the present disclosure;

FIG. 4A is a perspective view with partial cutaway of a socket strip with connectors in accordance with an embodiment of the present disclosure;

FIG. 4B is an exploded view of the embodiment of the connector shown in FIG. 4A;

DETAILED DESCRIPTION

Figure 1:
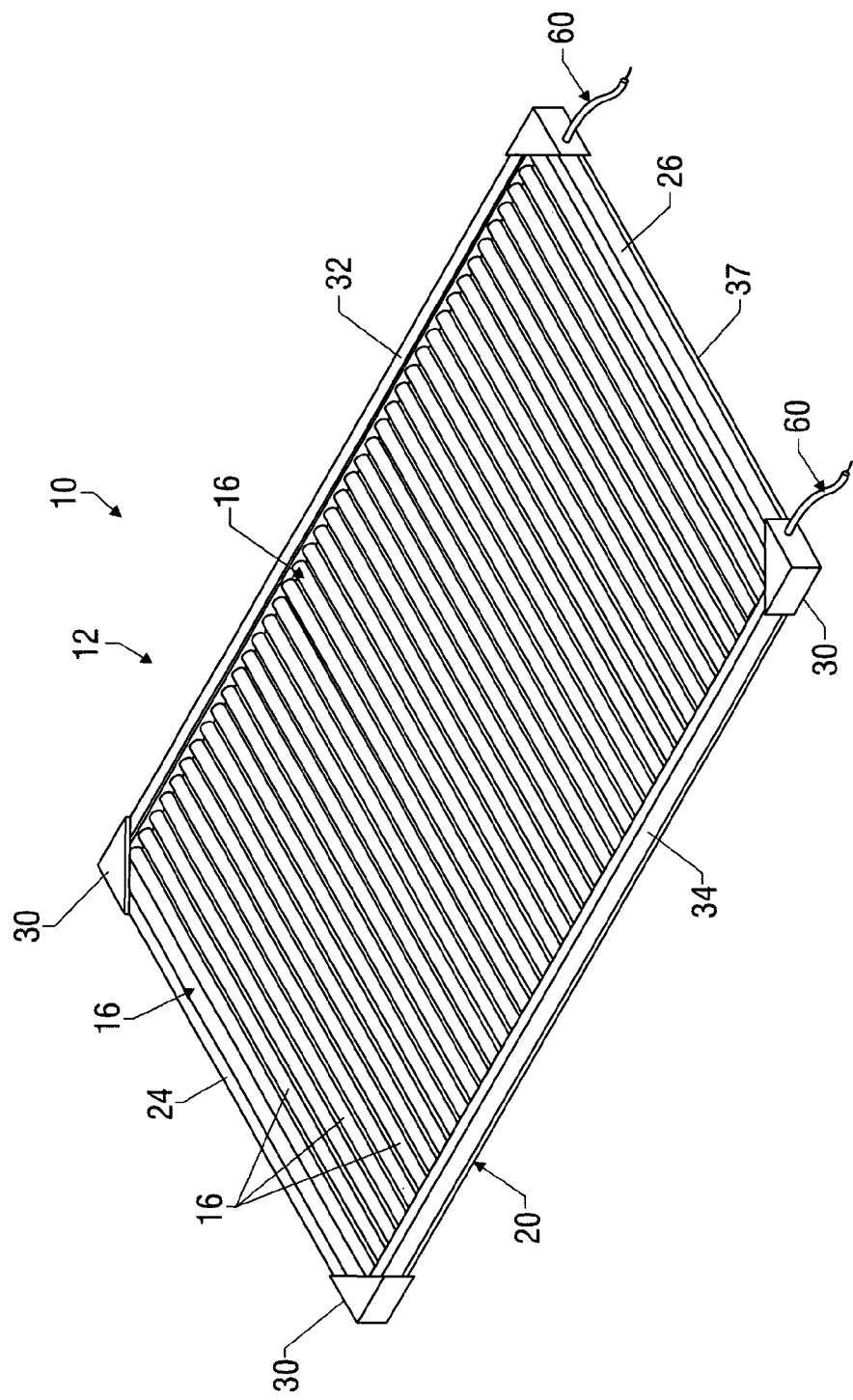
FIG. 1 is a perspective view of an example solar panel that includes a plurality of photovoltaic modules mounted in a frame.

Characteristics and advantages of the present disclosure and additional features and benefits will be readily apparent to those skilled in the art upon consideration of the following detailed description and referring to the accompanying figures. It should be understood that the description herein and appended drawings are of various exemplary embodiments and are not intended to limit the appended claims or the claims of any patent or patent application claiming priority to this application. On the contrary, the intention is to cover all modifications, equivalents and alternatives falling within the spirit and scope of the claims. Many changes may be made to the particular embodiments and details disclosed herein without departing from such spirit and scope.

In the description below and appended figures, common or similar features are indicated by like or identical reference numerals or, in the absence of a reference numeral, are evident based upon the appended figures and/or description herein. The figures are not necessarily to scale and certain features and certain views of the figures may be shown exaggerated in scale or in schematic in the interest of clarity and conciseness. It should also be noted that reference herein and in the appended claims to components and aspects in a singular tense does not necessarily limit the present disclosure to only one such component or aspect, but should be interpreted generally to mean one or more, as may be suitable and desirable in each particular instance.

Figure 2:
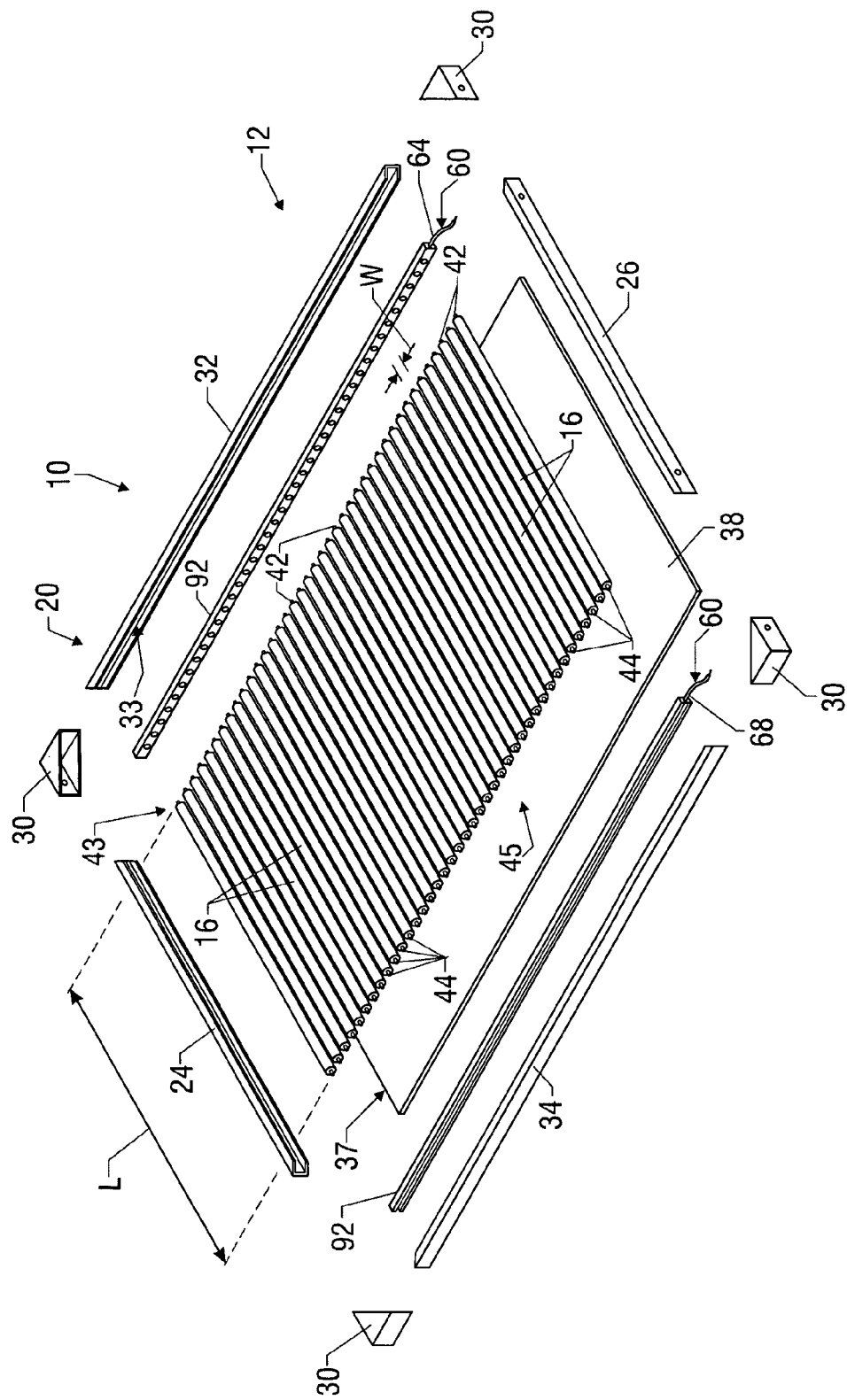
FIG. 2 is a plan view of the example solar panel of FIG. 1.

Referring initially to FIGS. 1 and 2, an example solar energy collection or absorption device 10, such as a solar panel 12, is shown having an array, or plurality, of photovoltaic modules, 16. If desired, the solar panel 12 may be used as part of a larger system of solar panels (not shown), as is and becomes further know. The photovoltaic modules 16 may have any suitable form, shape and construction. In the particular example shown, each module 16 is "elongated" because its length L (FIG. 2) is equal to or greater than three times its width, or diameter, W. However, the photovoltaic modules 16 may not be elongated and different types and configurations of photovoltaic modules 16 may be included in the same solar panel 12.

In this example, the modules 16 have a generally cylindrical overall shape with a generally circular cross-sectional shape to capture light from any direction. However, the modules 16 may have any suitable cross-sectional shape, such as square, rectangular, elliptical, polygonal, or have a varying cross-sectional shape, as well as desired overall shape and configuration. For example, the modules 16 may have a cylindric-like shape, bifacial or omnifacial configuration or be otherwise designed to capture light on planes both facing and not facing the initial light source. An example omnifacial topology of a module 16 may include a bifacial configuration where both its top and bottom planes accept light and produce electric power in response to that light. Another example omnifacial topology may collect reflected light on the back and/or sides of the module 16 and light striking the module 16 from any direction other than the planar orientation of the frame 20.

The modules 16 may have any suitable construction. Each module 16 of this example includes a monolithic substrate having a plurality of solar cells (not shown) disposed or manufactured on it. In other embodiments, the module 16 may include a monolithic substrate having one solar cell disposed on it. In yet other embodiments, the module 16 may include a plurality of solar cells each made on their own individual substrates and linked together electrically.

The solar panel 12 may have any other desired components and configuration. In the example shown, the solar panel 12 includes a frame 20 having a pair of opposing first and second side rails 24, 26 interconnected with a pair of opposing first and second end rails 32, 34. The illustrated rails 24, 26, 32, 34 are each substantially straight, but, if desired, may not be straight. In this example, the rails are connected together with corner brackets 30 and the end rails 32, 34 each have a concave portion, or groove, 33. The illustrated frame 20 may employ one or more reflective or increased-albedo surface or capability, such as a backplate 37 having a reflective surface 38 located behind the modules 16, to reflect and thus redirect light back to the modules 16.

The photovoltaic modules 16 may be arranged in any desired manner and configuration. In the example shown, over three dozen photovoltaic modules 16 are secured in generally spaced parallel relationship with one another within the frame 20. However, any number of modules 16 may be contained within the exemplary solar panel 20. The illustrated modules 16 generally run perpendicular to, and extend between, the end rails 32, 34. The modules 16 are engaged in, or affixed to, the rails 32, 34 so that they are not movable relative to the frame 20 or one another. Alternately, one or more modules 16 may be movable. For example, the modules 16 may be engaged in, or affixed to, the rails 32, 34 so that they may be individually or collectively swiveled or tilted at angles relative to the frame 20, such as to track the movement of the sun.

The exemplary modules 16 are spaced apart and positioned depth-wise in the frame 20 so that light is capable of passing through spaces formed between the modules 16 and the modules 16 can absorb light from the direction the light emanates or reflects. For example, the modules 16 may be capable of absorbing light passing through spaces between the modules 16 and reflected back from the backplate 37. Modules 16 having a cylindrical or cylindric-like shape, or bifacial or omnifacial configuration or otherwise enabled to capture the light on a plane not facing the initial light source, may absorb light emanating or reflecting from any direction and use it to generate electrical energy.

Figure 4C:
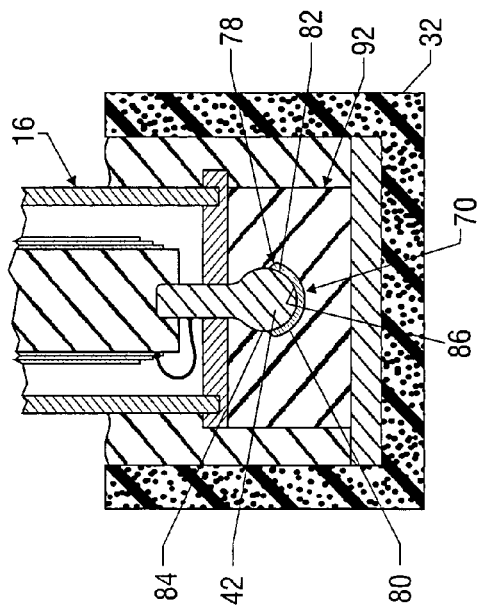
FIG. 4C is a partial sectional view of the connector of FIG. 4A shown engaged with an example photovoltaic module in accordance with an embodiment of the present disclosure.

Referring specifically to FIG. 2, each illustrated photovoltaic module 16 includes first and second electrical output contacts 42, 44 at its first and second ends 43, 45, respectively. The output contacts 42, 44 provide the electricity that is generated by the corresponding photovoltaic module 16. In this example, the first output contacts 42 are anodes and the second output contacts 44 are cathodes, but the opposite arrangement may instead be employed. As shown in FIGS. 3 and 4, all of the exemplary first output contacts 42 extend at least partially on a first common axis 50, while all of the second illustrated output contacts 44 extend at least partially on a second common axis 54. As used herein and in the appended claims, the term "axis" means a line or an area having a width that is no greater than approximately one-half its length. Further information about the components and operation of the example solar panel 12, photovoltaic modules 16 and their construction and operation are know and may be found in publicly available documents.

It should be understood that the present disclosure is not limited to any of the above details. For one example, each photovoltaic module 16 may include a single output contact or more than two output contacts at any desired location (e.g. intermediate to its ends). For another example, as previously mentioned, the photovoltaic modules 16 need not be mounted in a frame, nor be capable of having an omnifacial topology (e.g. capable of absorbing light from more than one direction). Moreover, all of the above-referenced components are not required for the present disclosure, the appended claims or the claims of any patent application or patent claiming priority hereto.

Now in accordance with the present disclosure, referring to the example of FIG. 2, at least one electrically conductive line 60 is capable of electrically connecting at least some of the photovoltaic modules 16 along a single axis (e.g. axes 50, 54, FIGS. 3, 4). As used herein and in the appended claims, the term "electrically conductive line" and variations thereof means any material(s) or component(s) capable of electrically joining at least two photovoltaic modules.

The electrically conductive line (ECL) 60 may have any suitable construction, and may electrically connect at least two photovoltaic modules 16 in any desired manner. For example, the ECL 60 may be a flexible or rigid metal wire or strip, or a series thereof, soldered to at least two output contacts 42. In the embodiment of FIGS. 2 and 3, a first ECL 64 extends on the first common axis 50 along the length of and within the first end rail 32 of the frame 20. The first ECL 64 electrically couples each of the first output contacts 42. A second ECL 68 is similarly situated with respect to the second common axis 54, second end rail 34 and second output contacts 44. It should be understood that the first and second ECLs 64, 68 need not necessarily each be a single wire or strip, but may instead each include a series of electrically conducting wires, strips or other members.

Referring now to FIG. 4A, the first ECL 64 of this embodiment is a bus-type connection line 66 that includes a metallic ribbon 67 extending through the length of the end rail 32. The illustrated bus-type connection line 66 electrically connects a plurality output contact connectors, 70. Each exemplary connector 70 is capable of engaging at least one output contact 42 (FIG. 3) of at least one photovoltaic module 16. The illustrated bus-type connection line 66 and connectors 70 connect all the anode contacts 42 of the modules 16 in a common line.

Figure 5:
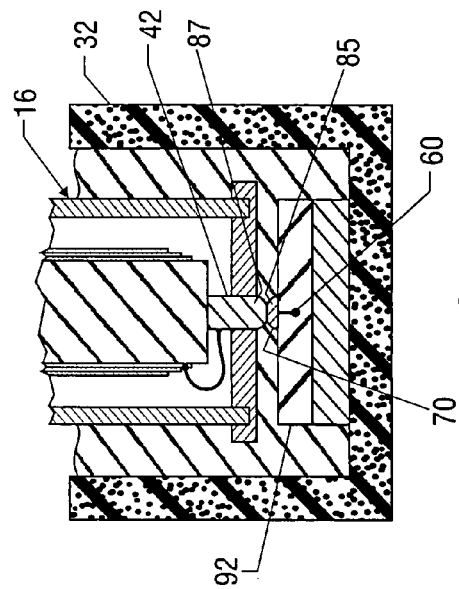
FIG. 5 is a partial sectional view of another embodiment of a connector in accordance with the present disclosure.
Figure 6:
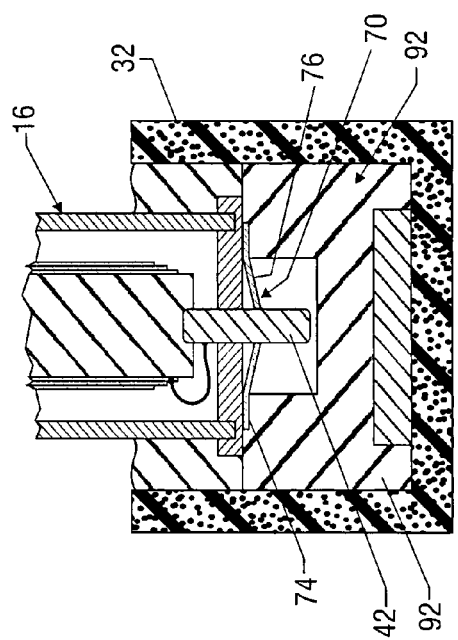
FIG. 6 is a partial sectional view of yet another embodiment of a connector in accordance with the present disclosure.
Figure 7:
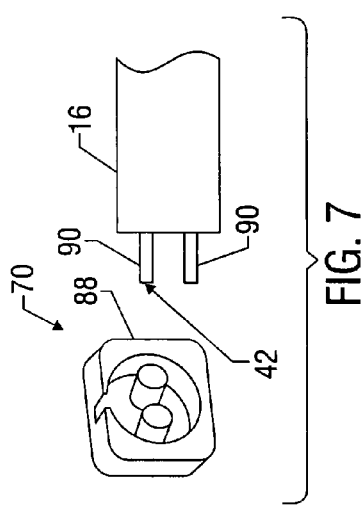
FIG. 7 is an isolated view of still a further embodiment of a connector in accordance with the present disclosure.

When included, the connectors 70 may have any suitable form and construction, and may electrically engage the ECL 60 and photovoltaic module(s) 16 in any suitable manner. For example, the ECL 60 and connectors 70 may be formed integrally in a single unit or connected by weld, solder or snapping engagement. In the embodiment shown, the illustrated row of connectors 70 are leaf members 74 having leaves 76 (e.g. FIG. 4B) that crimp or deform into engagement with an output contact 42 of a photovoltaic module 16 (e.g. FIG. 4C). In another embodiment, referring to FIG. 5, the connector 70 includes a receptacle 78 engageable with at least one output contact 42. In this embodiment, the receptacle 78 includes a curved member 80 engageable with a rounded portion 82 of the output contact 42. For example, the output contact 42 may have at least one solder point 84 that engages an at least partially C-shaped portion 86 of the curved member 80. In yet another embodiment, referring to FIG. 6, the connector 70 includes a button contact 85 engageable with a tip, or button contact, 87 of the contact 42. In still another example, referring to FIG. 7, each connector 70 may include a socket 88 (e.g. akin to the type of socket commonly used in overhead fluorescent light fixtures) that engages at least one prong 90 of at least one output contact 42.

The connectors 70 may be disposed within the solar panel 12 in any desired manner. For example, a row of connectors 70 may be integrally formed with the corresponding end rail 32, 34 as a single unitary body (not shown). For another example, a row of connectors 70 may be integrally formed in a unitary body (not shown) that is engaged with or embedded into the end rail 32, 34. In the embodiment of FIG. 4A, the connectors 70 and the bus-type connection line 66 are located within an insert, or socket strip, 92 that is positioned within the concave portion 33 of the first end rail 32. The illustrated socket strip 92 is designed to secure the connectors 70 in the frame 20 at predetermined spacing intervals to correspond with the orientation of the contacts 42 (e.g. FIG. 3). The socket strip 92 and connectors 70 of this example serve to both electrically connect and mechanically hold the modules 16 in position in the frame 20.

The socket strip 92 may have any suitable form, construction and configuration. In the embodiment of FIG. 4A, the socket strip 92 includes cavities 94 within which the connectors 70 are seated. Additional spaces (not shown) may be necessary for placement of the electrically conductive line(s) 60. In some embodiments, the socket strip 92 may be constructed of flexible material, such as rubber, to facilitate engagement with the corresponding end rail 32, 34, electrically insulate the ECL 60, assist in reducing stress applied to the modules 16, facilitate seating of the connectors 70 and/or their engagement with the modules 16, or any other desired purpose. In other embodiments, the socket strip 92 may be constructed of a rigid material, such as to provide rigidity to the end rails 32, 34, assist in maintaining the desired positioning of the modules 16, or other purpose. Likewise, the socket strip 92 may be constructed of a semi-rigid material, such as foam, or have portions of differing rigidity and flexibility.

The socket strip 92, when included, may be engaged with the solar panel 12 in any desired manner. For example, a socket strip 92 constructed at least partially of rubber or foam may be glued inside the associated end rail 32, 34. For other examples, the socket strip 92 may be press-fit, snapped or slid into the associated end rail 32, 34.

If desired, one or more mechanism may be associated with the socket strip 92, connectors 70, modules 16, rails 24, 26, 32, 34, or any combination thereof to allow the modules 16 to be moveable. For example, components may be included to automatically swivel or tilt the modules 16 to vary their angular orientation, such as to track the movement of the sun. However, the modules 16 may be configured in any position or angular relationship relative to the rails 24, 26, 32, 34, as long as they are electrically connected within, or to, at least one rail.

It should be noted that the details of construction and operation of the first ECL 64 of this embodiment as described above and shown in FIG. 4A apply equally, as appropriate, to the second ECL 68 of this embodiment.

The electrical energy, or voltage, from the modules 16 may be communicated by the electrically conductive line(s) 60 from the solar panel 12 in any desired manner. In the embodiment of FIG. 3, for example, the first ECL 64 connects all the (anode) output contacts 42 of the modules 16 to a common anode terminal 96, such as a commercially available male or female electrical plug or socket (not shown). Similarly, the second ECL 68 connects all the (cathode) output contacts 44 to a common cathode terminal 98. The illustrated modules 16 are thus connected in parallel. In this manner, the electrical connection between the modules 16 of this example is defined by two bus-like connections embedded within the framework. However, the present disclosure includes embodiments having one or more electrically conductive lines 60 engageable in any suitable manner with any desired number of electrical output contacts of photovoltaic modules 16. For example, one ECL 60 may electrically connect some of the output contacts 42 in the first end rail 32, while another ECL 60 electrically connects other of the output contacts 42 in the same rail 32.

Accordingly, apparatuses and methods useful for electrically connecting two or more photovoltaic modules in a solar panel are described. These apparatuses and methods have one or more of the following attributes, capabilities or features: an electrical connection of at least two elongated photovoltaic modules of a solar panel along a common axis; an electrical connection of at least two elongated photovoltaic modules of a solar panel in a generally straight path; a bus-type connection that connects all the anode contacts of elongated photovoltaic modules in a common line; a bus-type connection that connects all the cathode contacts of elongated photovoltaic modules in a common line; a first bus-type connection that connects all the anode contacts of the photovoltaic modules in a common line and a second bus-type connection that connects all the cathode contacts of the photovoltaic modules in a common line; electrically connects photovoltaic modules within one or more structural member of the solar panel; electrically connects photovoltaic modules within one or more rail of the solar panel; electrically connects the photovoltaic modules in parallel within the end rails of the solar panel; electrically connects elongated photovoltaic modules; electrically connects photovoltaic modules capable of absorbing solar energy from any direction; electrically connects photovoltaic modules capable of absorbing solar energy from more than one planar direction; electrically connects all photovoltaic modules of a solar panel with one or more electrically conductive line of minimal length; is reliable and easy to manufacture and utilize.

Embodiments of the present disclosure thus offer advantages over the prior art and are well adapted to carry out one or more of the objects of the disclosure. However, each of the appended claims do not require each of the components and acts described above and is in no way limited to the above-described embodiments and methods of assembly and operation. Any one or more of the above components, features and processes may be employed in any suitable configuration without inclusion of other such components, features and processes. Moreover, the present disclosure includes additional features, capabilities, functions, methods, uses and applications that have not been specifically addressed herein but are, or will become, apparent from the description herein, the appended drawings and claims.

The methods described above and which may be claimed herein and any other methods which may fall within the scope of the appended claims can be performed in any desired suitable order and are not necessarily limited to the sequence described herein or as may be listed in any appended claims. Further, the methods of the present disclosure do not necessarily require use of the particular embodiments shown and described in the present application, but are equally applicable with any other suitable structure, form and configuration of components.

While embodiments have been shown and described, many variations, modifications and/or changes of the system, apparatus and methods herein, such as in the components, details of construction and operation, arrangement of parts and/or methods of use, are possible, contemplated by the patent applicant(s), within the scope of the appended claims, and may be made and used by one of ordinary skill in the art without departing from the spirit or teachings of this disclosure and scope of appended claims. Thus, all matter herein set forth or shown in the accompanying drawings should be interpreted as illustrative, and the scope of this disclosure and the appended claims should not be limited to the embodiments described and shown herein.

The invention claimed is:

1. An apparatus for electrically connecting a plurality of elongated photovoltaic modules located within a solar panel, the solar panel including a frame having first and second opposing side rails and first and second opposing end rails, each photovoltaic module having a width and a first output contact, the plurality of first output contacts extending at least partially on a first common axis, the apparatus comprising at least one insert disposed within at least one of the rails of the frame and having a plurality of connectors at least partially disposed therein, each said connector being useful to electrically engage at least of the first output contacts;

a plurality of spaces formed between the photovoltaic modules, each said space being disposed between a pair of adjacent photovoltaic modules and having a width extending from one to the other corresponding adjacent photovoltaic modules, wherein each among a majority of said plurality of spaces has a width that is equal to or greater than approximately one-half of the width of the corresponding adjacent photovoltaic modules having the larger width; and a first electrically conductive line extending at least partially along the first common axis, wherein said first electrically conductive line is engageable said plurality of connectors wherein the first common axis and said first electrically conductive line extend at least partially along the length of and within at least one said insert, and wherein said first electrically conductive line electrically connects the plurality of first output contacts within said insert.

2. The apparatus of claim 1 wherein each first output contact is the anode output contact of the respective corresponding photovoltaic module, whereby said first electrically conductive line connects the plurality of photovoltaic modules in parallel.

3. The apparatus of claim 1 wherein each first output contact is the cathode output contact of the respective corresponding photovoltaic module, whereby said first electrically conductive line connects the plurality of photovoltaic modules in parallel.

4. The apparatus of claim 1 wherein each of the plurality of photovoltaic modules is in generally spaced parallel relationship with one another.

5. The apparatus of claim 4, wherein said first electrically conductive line extends at least partially along the length of the first end rail and electrically connects the plurality of first output contacts of the plurality of photovoltaic modules within the first end rail.

6. The apparatus of claim 1 wherein each said connector includes at least one leaf member.

7. The apparatus of claim 1 wherein each said connector includes at least one receptacle.

8. The apparatus of claim 1 wherein each of the first output contacts includes at least one prong, and each said connector includes a socket engageable with at least one prong of at least one first output contact.

9. The apparatus of claim 1 wherein said first electrically conductive line and said plurality of connectors are interconnected by snapping engagement.

10. The apparatus of claim 1 wherein said plurality of connectors is integrally formed in a unitary body.

11. The apparatus of claim 1 wherein the first end rail includes at least one concave portion, wherein said plurality of connectors is disposed within at least one concave portion of the first at least substantially straight member.

12. The apparatus of claim 11, wherein said at least one insert includes at least one cavity, wherein said plurality of connectors is disposed within at least one said cavity.

13. The apparatus of claim 11 wherein said at least one insert is constructed at least partially of rubber.

14. The apparatus of claim 11 wherein said at least one insert is constructed at least partially of foam and is glued to the first end rail.

15. The apparatus of claim 13 wherein said first electrically conductive line is disposed within at least one said cavity of said at least one insert.

16. The apparatus of claim 1 wherein each photovoltaic module includes a second output contact, the plurality of second output contacts extending at least partially on a second common axis, further including a second electrically conductive line extending at least partially along the second common axis, wherein the second electrically conductive line is engageable with and capable of electrically connecting the plurality of second output contacts along the second common axis.

17. The apparatus of claim 16 wherein each first output contact is the anode output contact of the respective corresponding photovoltaic module and each second output contact is the cathode output contact of the respective corresponding photovoltaic module, whereby said first and second electrically conductive line connects the plurality of photovoltaic modules in parallel.

18. The apparatus of claim 17 wherein wherein the first common axis and said first electrically conductive line extend at least partially along the length of and within the first end rail, and wherein the second common axis and said second electrically conductive line extend at least partially along the length of and within the second end rail.

19. An apparatus capable of electrically connecting a plurality of elongated photovoltaic modules disposed in generally spaced parallel relationship with one another within a solar energy absorption device, the solar energy absorption device including a frame having a plurality of rail, each of the plurality of elongated photovoltaic modules having an anode output contact that extends at least partially on a first common axis and a cathode output contact that extends at least partially on a second common axis, the apparatus comprising:

a first electrically conductive line extending at least partially along the first common axis, wherein said first electrically conductive line is capable of electrically connecting together the plurality of cathode output contacts along the first common axis;

a second electrically conductive line extending at least partially along the second common axis, wherein said second electrically conductive line is capable of electrically connecting together the plurality of anode output contacts along the second common axis and a first socket strip disposed within at least one of the rails of the frame and having a plurality of connectors at least partially disposed therein, each said connector being useful to electrically engage at least one of the cathode output contacts, wherein the first common axis and said first electrically conductive line extend at least partially along the length of and within said first socket strip, and wherein said first electrically conductive line electrically connects the plurality of cathode output contacts within said first socket strip.

* * * * *